(12) United States Patent
Isobe et al.

(10) Patent No.: US 7,115,488 B2
(45) Date of Patent: Oct. 3, 2006

(54) METHOD OF MANUFACTURING SEMICONDUCTOR DEVICE

(75) Inventors: Atsuo Isobe, Kanagawa (JP); Satoru Saito, Kanagawa (JP); Saishi Fujikawa, Kanagawa (JP)

(73) Assignee: Semiconductor Energy Laboratory Co., Ltd., (JP)

( * ) Notice: Subject to any disclaimer, the term of this patent is extended or adjusted under 35 U.S.C. 154(b) by 0 days.

(21) Appl. No.: 10/919,513

(22) Filed: Aug. 17, 2004

(65) Prior Publication Data

US 2005/0048744 A1   Mar. 3, 2005

(30) Foreign Application Priority Data

Aug. 29, 2003  (JP)  ............................. 2003-307489

(51) Int. Cl.
*H01L 21/20* (2006.01)
(52) U.S. Cl. ...................................................... 438/491
(58) Field of Classification Search ................. None
See application file for complete search history.

(56) References Cited

U.S. PATENT DOCUMENTS

| | | | |
|---|---|---|---|
| 5,587,330 A | 12/1996 | Yamazaki | |
| 5,627,084 A * | 5/1997 | Yamazaki et al. | .......... 438/166 |
| 5,817,549 A | 10/1998 | Yamazaki et al. | |
| 5,840,600 A | 11/1998 | Yamazaki et al. | |
| 5,970,384 A | 10/1999 | Yamazaki et al. | |
| 6,168,980 B1 | 1/2001 | Yamazaki et al. | |
| 6,210,997 B1 | 4/2001 | Adachi et al. | |
| 6,465,284 B1 | 10/2002 | Adachi et al. | |
| 6,545,359 B1 | 4/2003 | Ohtani et al. | |
| 6,635,589 B1 | 10/2003 | Yamazaki et al. | |
| 6,660,609 B1 | 12/2003 | Tanaka et al. | |
| 2002/0025591 A1 | 2/2002 | Ohnuma et al. | |
| 2002/0053669 A1 | 5/2002 | Suzawa et al. | |
| 2002/0149016 A1 * | 10/2002 | Yamazaki et al. | ............ 257/59 |
| 2002/0192931 A1 | 12/2002 | Hayakawa | |
| 2003/0027382 A1 | 2/2003 | Uehara et al. | |
| 2003/0059990 A1 | 3/2003 | Yamazaki | |
| 2003/0089991 A1 | 5/2003 | Yamazaki et al. | |
| 2003/0129790 A1 | 7/2003 | Yamazaki et al. | |
| 2003/0211662 A1 * | 11/2003 | Yamazaki et al. | .......... 438/142 |
| 2004/0132293 A1 | 7/2004 | Takayama et al. | |
| 2005/0003568 A1 | 1/2005 | Yamazaki et al. | |
| 2005/0110016 A1 | 5/2005 | Yamazaki | |
| 2005/0110091 A1 | 5/2005 | Yamazaki et al. | |

FOREIGN PATENT DOCUMENTS

| | | |
|---|---|---|
| JP | 07-094756 | 4/1995 |
| JP | 2000-252473 | 9/2000 |
| JP | 2002-033273 | 1/2002 |

* cited by examiner

*Primary Examiner*—Chandra Chaudhari
(74) *Attorney, Agent, or Firm*—Fish & Richardson P.C.

(57) ABSTRACT

Since sodium contained in glass, or glass itself has low heat resistance; a CPU fabricated using a TFT formed over a glass substrate or the like has not been obtained. In the case of operating a CPU with high-speed, the length of a gate (gate length) of a TFT is required to be shorter. However, since a glass substrate has large deflection, a gate electrode cannot have been etched to have a gate length short enough to be used for a CPU. According to the invention, a conductive film is formed over a crystalline semiconductor film formed over a glass substrate, a mask is formed over the conductive film, and the conductive film is etched by using the mask; thus, a thin film transistor with a gate length of 1.0 μm or less is formed. In particular, the crystalline semiconductor film is formed by crystallizing an amorphous semiconductor film formed over a glass substrate by laser irradiation.

40 Claims, 9 Drawing Sheets

METHOD OF MANUFACTURING SEMICONDUCTOR DEVICE

BACKGROUND OF THE INVENTION

1. Field of the Invention

The present invention relates to a semiconductor device, particularly a central processing unit (a CPU), for improving processing speed, in which a thin film transistor is formed over a glass substrate. The invention further relates to a method of manufacturing the semiconductor device.

2. Description of the Related Art

A conventional CPU has been fabricated by stacking semiconductor elements using a single crystal semiconductor substrate, that is, IC (integrated circuit) chips formed over what is called a silicon wafer. Such a CPU has an operation speed of more than 1 GHz, and higher frequency has been achieved in some CPUs. An integrated circuit with even higher operating frequency is expected to acheive in the future.

Active matrix type semiconductor devices including a thin film transistor formed over an inexpensive glass substrate has been developed. In particular, a technology of integrally forming an integrated circuit and a pixel area over a glass substrate to obtain a system on panel has been valued. Correspondingly, research on the formation of a large-scale integrated circuit using a thin semiconductor film has been promoted. Especially, a TFT using a polycrystalline semiconductor film has high mobility; accordingly, the TFT is expected to be a semiconductor element for fabricating a system on panel.

Some of such technologies for forming TFTs over glass substrates are shown below.

As to methods each for fabricating an insulated gate silicon semiconductor device which exhibits preferable characteristics when provided over a substrate that has low heat resistance, there is a method in which the surface of a silicon semiconductor film formed over a glass substrate with an insulating film therebetween, is exposed to an oxidizing atmosphere such as an oxygen atmosphere and further exposed to intense light to form an ultrathin oxide film over the surface of the silicon semiconductor film, and a gate insulating film is thereafter formed by plasma CVD or the like. (Reference 1: Japanese Patent Laid-Open No. 7-94756)

As another method for obtaining a high performance semiconductor device having a good ohmic contact structure, a wiring having a layered structure with more than three layers is formed and when a contact hole connected to the wiring is formed, a second conductive film of the wiring is used as an etching stopper. (Reference 2: Japanese Patent Laid-Open No. 2000-252473)

As yet another method, as to a method for forming a TFT having a GOLD structure obtained by etching a gate electrode having a first and a second layers, a resist pattern serving as an etching mask of a gate electrode is formed by photolithography, and only the second layer of the gate electrode is taper etched. The resist pattern has a finely controlled tapered angle. (Reference 3: Japanese Patent Laid-Open No. 2002-33273)

However, since a conventional CPU is formed over a silicon wafer, expensive machinery and materials are required. Further, the flexibility of the device has been poor.

Since sodium is contained in glass and glass itself has low heat resistance, a CPU fabricated using a TFT formed over a glass substrate or the like have not been obtained.

In the case of operating a CPU with high-speed, the length of a gate (gate length) of a TFT is required to be shorter. However, since a glass substrate has large deflection, a gate electrode cannot have been etched to have a gate length short enough to be used for a CPU.

BRIEF SUMMARY OF THE INVENTION

The present invention has been made in view of the above problems and it is an object of the invention to provide a CPU using a TFF formed over a glass substrate. Specifically, it is an object of the invention to fabricate a CPU comprising a TFT with a gate length of 1.0 μm or less.

According to the invention, a conductive film is formed over a crystalline semiconductor film formed over a glass substrate, a mask is formed over the conductive film, and the conductive film is etched by using the mask; thus, a thin film transistor with a gate length of 1.0 μm or less is obtained. In particular, the crystalline semiconductor film is formed by crystallizing an amorphous semiconductor film over the glass substrate by laser irradiation.

As laser light, one or more of Ar laser, Kr laser, excimer laser, YAG laser, $Y_2O_3$ laser, $YVO_4$ laser, YLF laser, $YAlO_3$ laser, glass laser, ruby laser, alexandrite laser, Ti: sapphire laser, copper vapor laser, and gold vapor laser are used.

A continuous wave laser (hereinafter also referred to as CW laser) and a pulsed laser can be used. It is preferable that the beam profile is a linear shape, and the length of the major axis shall be 200 μm to 350 μm. Further, the laser light may have an incidence angle of θ1 (0°<θ1<90°) with a semiconductor film.

According to the invention, a conductive film is etched by using a mask having a tapered shape. The tapered shape shall have an angle of θ2 between the base of the mask and the oblique side (end surface). The angle θ2 shall be in the range of 20°<θ2<85°, preferably, 45°<θ2<60°. The mask having the tapered shape can be formed of an organic or an inorganic material. Specifically, a resist material may be used as an organic material, or a silicon oxide film may be used as an inorganic material. Note that "having tapered shape" means to have tapered shape on the end surface of the mask.

Further according to the invention, a conductive film shall have a layered structure in which at least a first conductive film and a second conductive film are stacked in order. In the case of etching the second conductive film using the mask, the first conductive film is used as a so-called etching stopper. The length of the etched second conductive film in the channel length direction (that is length equivalent to the gate length) can be reduced to 1.0 μm or less by using the first conductive film as an etching stopper.

Especially, a TFT with a gate length of 1.0 μm or less is sometimes called a submicron TFT. In such a submicron TFT, the diameter of an opening (also referred to as a contact hole) formed in an insulating film for connecting an impurity region formed in a semiconductor film and a wiring (equivalent to a source electrode or a drain electrode) is also made small. As the contact hole is provided vertically, the migration of carriers between a channel and a contact hole can be reduced. Accordingly, an end portion of a mask used for forming a contact hole is intended not to have tapered shape. When the selectivity of the mask is high, the end portion of the mask may have tapered shape. A material of the mask having a vertical end portion may be selected from an organic material and an inorganic material depending on the material of the insulating film where an opening is formed. Specifically, in the case of an insulating film formed of an inorganic material, a mask of an organic material such as a resist material is used, and in the case of an insulating film formed of an organic material, a mask of an inorganic material such as silicon oxide may be used.

Further in the case of a submicron TFT, the thickness of a gate insulating film provided between a semiconductor film and a gate electrode becomes thin. Accordingly, when the surface of a semiconductor film is washed with hydrofluoric acid before forming a gate insulating film, dimples or depressions are formed in the base film; accordingly, the step coverage of the thinned gate insulating film is reduced. Therefore, it is preferable to avoid the formation of dimples or depressions by nitriding the base film before cleaning the surface of the semiconductor film.

By using a thin film transistor formed as above, a semiconductor device, particularly, a CPU (a central processing unit) can be fabricated. Thus fabricated semiconductor device or a CPU can be operated at high speed.

While fabricating a conventional CPU using a silicon wafer requires expensive machinery and materials, a CPU comprising a TFT formed over a glass substrate can be obtained by using only low cost machinery; thus, a low cost CPU can be fabricated. Further, as compared with the CPU using a silicon wafer, the CPU using a TFT formed over a glass substrate is light in weight, and it is preferable for carrying and mounting.

According to the invention, an information processing circuit such as a CPU or a memory as well as a display area and a peripheral circuit including a driver circuit area can be integrally formed on one glass substrate. Further, flexibility can be obtained according to the invention; which can contribute to achieve what is called a sheet computer.

DETAILED DESCRIPTION OF THE INVENTION

Embodiment modes of the present invention will be described with reference to the accompanying drawings. Note that the present invention can be implemented in various modes, and it is understood easily by those skilled in the art that embodiment modes and details of the invention can be variously changed without departing from the spirit and scope of the invention. Accordingly, the contents of the embodiment modes shall not be construed as limiting the present invention. Incidentally, identical parts and parts having similar functions are denoted by the same reference numerals, and the explanation thereof shall not be repeated.

Embodiment Mode 1

In this embodiment mode, a specific manufacturing process will be described.

Figure 1A:
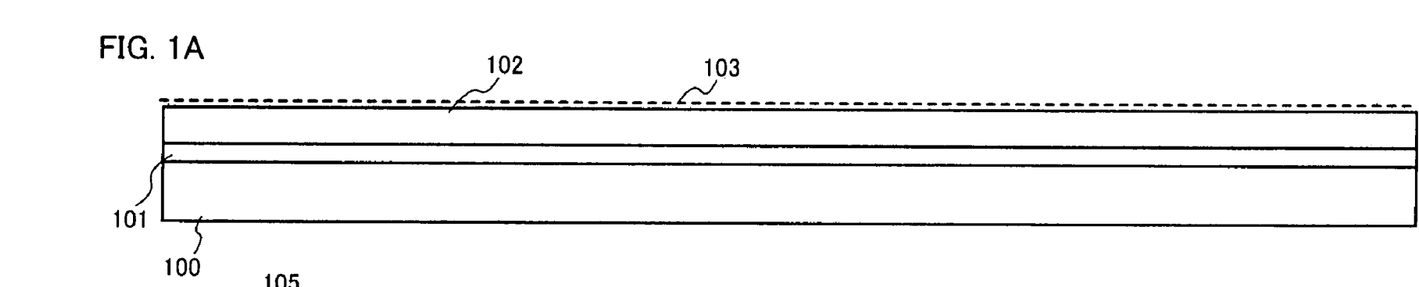
FIGS. 1A to 1C show manufacturing steps of thin film transistors of the invention.

As shown in FIG. 1A, a base film 101 is formed over a substrate 100 having an insulating surface. A glass substrate of such as barium borosilicate glass or alumino borosilicate glass, a quartz substrate, a SUS substrate, or the like can be used for the substrate 100, for example. In addition, although a substrate comprising flexible synthetic resin such as acryl or plastic typified by PET, PES, PEN, or the like tends to have lower heat resistance than that of the above substrates, the substrate comprising flexible synthetic resin can be used when it can resist the heat generated in the manufacturing process.

The base film 101 is provided in order to prevent alkali-earth metal or alkali metal such as Na contained in the substrate 100 from diffusing into a semiconductor film formed thereon and adversely affecting the characteristics of a semiconductor element. Therefore, the base film is an insulating film comprising silicon oxide, silicon nitride, or silicon nitride oxide which can suppress the diffusion of the alkali-earth metal and alkali metal into the semiconductor film. In this embodiment mode, a silicon nitride oxide film (SiNO) is formed to a thickness from 10 nm to 200 nm (50 nm in this embodiment mode) by plasma CVD using $SiH_4$, $NH_3$, and $N_2O$ as a reactive gas; and a silicon oxynitride film (SiON) is formed to a thickness from 50 nm to 200 nm (100 nm in this embodiment mode) by plasma CVD using $SiH_4$ and $N_2O$ as a reactive gas. The SiNO film and the SiON film are stacked in order. Also, the base film 101 may have a single layer structure. For example, a silicon oxynitride film may be formed to a thickness from 10 nm to 400 nm (preferably from 50 nm to 300 nm).

In the case of using a substrate containing more or less alkali metal or alkali-earth metal such as a glass substrate, a SUS substrate, or a plastic substrate, it is effective to provide the base film in terms of preventing the diffusion of impurities. However, when the diffusion of impurities does not lead to any significant problems, for example in the case of quartz substrate, the base film is not necessarily required to be provided.

An amorphous semiconductor film is formed over the base film 101. The film thickness of the amorphous semiconductor film 102 is set in the range of 25 nm to 100 nm (preferably in the range of 30 nm to 60 nm). Silicon germanium can be used instead of the silicon film for the amorphous semiconductor. In the case of using silicon germanium, the concentration of germanium is preferably in the range of 0.01 atomic % to 4.5 atomic %. A semiconductor film comprising silicon (also referred to as an amorphous silicon film) having a thickness of 66 nm is used in this embodiment mode.

Next, a metal element is added into the amorphous semiconductor film 102. It is noted that "adding the metal element" means forming a layer comprising the metal element on the surface of the amorphous semiconductor film 102 so as to promote the crystallization of the amorphous semiconductor film. The amorphous semiconductor film can be crystallized at preferably low temperature by adding the metal element.

For example, Ni solution (including aqueous solution and acetic acid solution) is applied onto the amorphous semiconductor film 102 by an application method such as spin coating or dip coating to form a film 103 containing Ni (however, this film is so thin that it may not be observed as a film). On this occasion, in order to improve wettability of the surface of the amorphous semiconductor film 102 and to coat all over the surface thereof with the Ni solution, it is desirable to form an oxide film (not shown) to a thickness from 10 Å to 50 Å (1 nm to 5 nm) on the amorphous semiconductor film 102 by UV irradiation in an oxygen atmosphere, by thermal oxidation, by treatment with ozone water containing hydroxyl radical, or by treatment with hydrogen peroxide. Alternatively, Ni can be added to the amorphous semiconductor film in such a way that Ni ions are injected by ion implantation, heat treatment is performed in a water vapor atmosphere containing Ni, or sputtering is performed using Ni material as a target under Ar plasma. In this embodiment mode, an aqueous solution containing Ni acetate by 10 ppm is applied by spin coating.

After that, the amorphous semiconductor film 102 is heat-treated at a temperature ranging from 500° C. to 550° C. for 2 hours to 20 hours to crystallize the amorphous semiconductor film so that a crystalline semiconductor film is formed. In the heat treatment, it is preferable to change the heating temperature gradually. This is because the initial low-temperature heat treatment can extract hydrogen and the like from the amorphous semiconductor film, which is called dehydrogenation and is performed thereby reducing the roughness of the film in the crystallization. Alternatively, a magnetic field may be applied to crystallize the semiconductor film in combination with its magnetic energy, or a microwave of high output may be also used. In this embodiment mode, the heat treatment is performed at a temperature of 500° C. for one hour and then at a temperature of 550° C. for four hours using a vertical furnace.

Figure 1B:
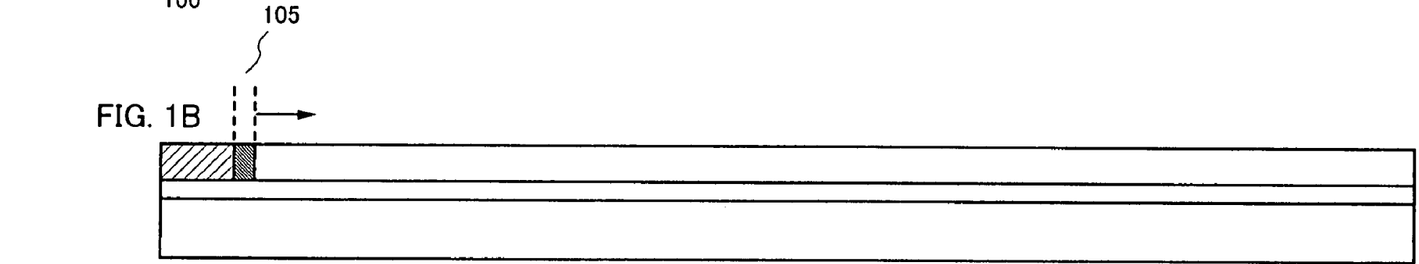

Next, as shown in FIG. 1B, the oxide film formed on the surface of the crystalline semiconductor film is etched away using hydrofluoric acid. Then, after crystallizing the amorphous semiconductor film 102, the semiconductor film is irradiated with laser light (a laser beam) 105. As laser, one or more Ar laser, Kr laser, excimer laser, YAG laser, $Y_2O_3$ laser, $YVO_4$ laser, YLF laser, $YAlO_3$ laser, glass laser, ruby laser, alexandrite laser, Ti: sapphire laser, copper vapor laser, and gold vapor laser are used. A continuous wave laser (hereinafter referred to as CW laser) and a pulsed laser can be used. It is preferable that the beam profile is linear shape, and the length of the major axis shall be 200 μm to 350 μm. Further, laser light may have an incidence angle of θ1 (0°<θ1<90°) with the semiconductor film.

In this embodiment mode, the semiconductor film is irradiated with CW laser light 105 of 6.4 W at an incidence angle of θ1=25°; the long axis of the laser beam shall be 300 μm, and the scanning speed is set at 40 cm/sec. In this case, good crystal growth can be obtained in a region having a width (which is a length perpendicular to the direction of laser scanning) of 210 μm. Thus, when the semiconductor film is irradiated with the laser by scanning the laser beam back and forth on the substrate, the long axis of the laser beam is overlapped by 90 μm to a region of the semiconductor film where has been irradiated with the laser beam already.

In the case of such laser irradiation, markers may be formed to control the starting position and the end position of irradiation, or to accurately overlap. The marker may be formed over the substrate by using the same material at the same time as the amorphous semiconductor film.

Subsequently, gettering is performed to reduce or remove the metal element from the semiconductor film. In this embodiment mode, a method in which the metal element is gettered (captured) using the amorphous semiconductor film as a gettering sink will be described. First, an oxide film is formed over the crystalline semiconductor film by UV irradiation in an oxygen atmosphere, thermal oxidation, treatment with ozone water containing hydroxyl radical, treatment with hydrogen peroxide, or the like. Further, an amorphous semiconductor film is formed to a film thickness of 150 nm by plasma CVD using $SH_4$ and Ar as a source gas, at a pressure of 0.3 Pa, an RF power of 3 KW, and a substrate temperature of 150° C.

After that, heat treatment is performed at 550° C. in a nitrogen atmosphere for 4 hours thereby reducing or removing the metal element. Then, the amorphous semiconductor film to be a gettering sink and the oxide film is removed by hydrofluoric acid or the like; thus, a crystalline semiconductor film in which the metal element is reduced or removed can be obtained.

Figure 1C:
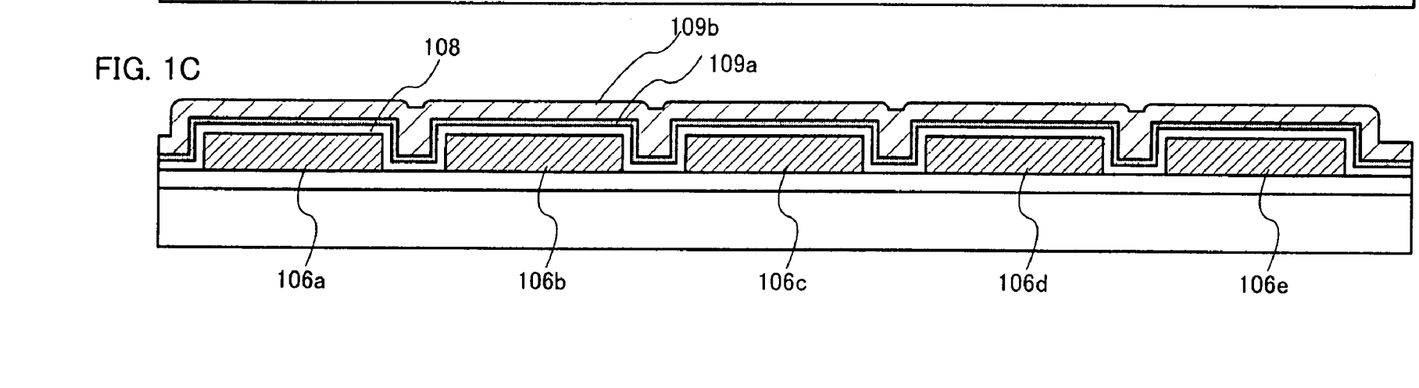

As shown in FIG. 1C, the crystalline semiconductor film is patterned to a predetermined shape to obtain semiconductor islands 106a to 106e. Before the patterning, a photoresist is applied to the crystalline semiconductor film, and then the crystalline semiconductor film is exposed and baked to obtain a predetermined mask shape. Thus, masks are formed on the crystalline semiconductor film. The crystalline semiconductor film is patterned by using the masks. $CH_4$ and $O_2$ are used as a dry etching gas.

Thereafter, impurities are added to the crystalline semiconductor film as necessary. For example, boron (B) is added by doping. Thus, the threshold value that is a property of a thin film transistor can be approximated to zero. In other words, the crystalline semiconductor film can be made more intrinsic.

Subsequently, an insulating film, what is called a gate insulating film 108 is formed to cover the semiconductor islands 106a to 106e. The surfaces of the semiconductor islands are cleaned with hydrofluoric acid or the like. The gate insulating film 108 is formed with an insulating film comprising silicon to a thickness from 10 nm to 150 nm, preferably, 20 nm to 40 nm by plasma CVD or sputtering. In this embodiment mode, a silicon oxynitride film is formed to a thickness of 20 nm by plasma CVD using $SiH_4$ and $N_2O$ as a source gas at a temperature of 400° C. in a film formation chamber. At that time, the thickness of the gate insulating film is thinner; therefore, the deposition rate thereof is made lower. As a result, deterioration in the primary period of the film formation can be reduced. Naturally, the gate insulating film is not limited to the silicon oxynitride film, and may have a single layer structure or a layered structure of other insulating films containing silicon may be used.

After that, conductive films 109a and 109b to be gate electrodes 109 are formed over the crystalline semiconductor film with a gate insulating film 108 therebetween. The gate electrodes 109 may have either a single layer structure or a layered structure. The conductive films 109a and 109b may be each formed of an element selected from Ta, W, Ti, Mo, Al, and Cu, or an alloy material or a compound material containing the above elements as main components. In this embodiment mode, a tantalum nitride film with a thickness from 10 nm to 50 nm, 30 nm for example, is formed as a first conductive film 109a, and a tungsten film with a thickness from 200 nm to 400 nm, 370 nm for example, is formed as a second conductive film 109b. The first and the second conductive films 109a and 109b are stacked in order.

The first conductive film 109a and the second conductive film 109b are thereafter etched using a mask. First, a photoresist is applied to the conductive films by spin coating. The photoresist may use either positive type or negative type. Also, a resist mask added with an extinction agent may be used. In this embodiment mode, a positive novolac type added with an extinction agent is used.

Heat treatment called prebake is performed to the applied photoresist. The heating temperature of the prebake shall be 50° C. to 120° C. The temperature is set lower than post bake to be performed later. In this embodiment mode, prebake is performed at a heating temperature of 90° C. for a heating time of 90 sec.

Subsequently, exposure is performed to transfer the mask to the photoresist by using a stepper. In this embodiment mode, a stepper is used as an exposure device. Exposure time may be 150 msec to 250 msec, and is set at 205 msec in this embodiment mode, since a gate length of 0.8 μm is required. Exposure time of 175 msec is applied in the case of a gate length of 1.0 μm, and exposure time of 320 msec is applied in the case of a gate length of 0.6 μm. Accordingly, exposure time can be set in accordance with the desired gate length.

After that, the applied photoresist is developed by dropping or spraying a developer to the photoresist, and heat treatment is performed. In this embodiment mode, NMD-3 is used as a developer, and the development time shall be 60 sec.

Figure 2A:
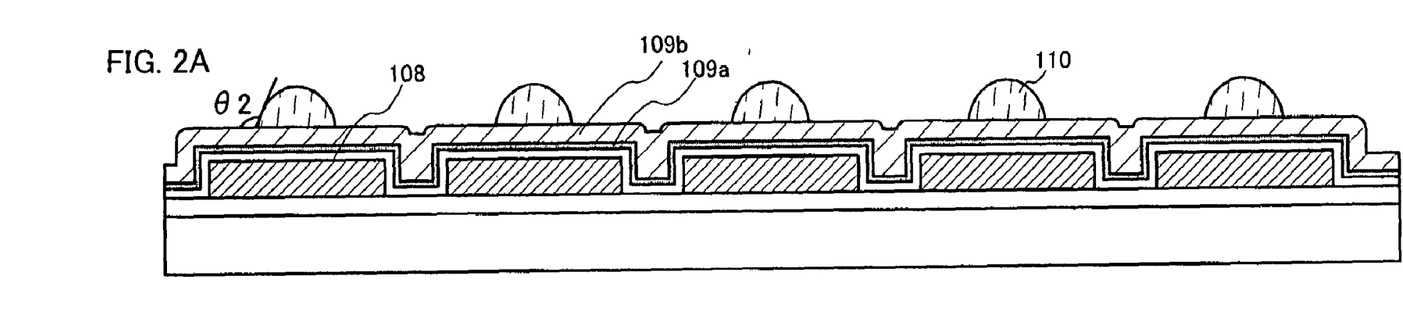
FIGS. 2A to 2C show manufacturing steps of thin film transistors of the invention.

Heat treatment of the developed photoresist, what is called postbake is performed thereafter at 125° C. for 180 sec in this embodiment mode. As a result, moisture or the like remained within the resist mask is removed and the stability against heat can be improved at the same time. Accordingly, resist masks 110 having tapered shape each with an angle of θ2 on the end surface are formed over the conductive films (FIG. 2A). At this time, the resist masks may have shape of sector or trapezoid. Also, cross sections of the resist masks may have round portions.

Alternatively, resist masks having tapered shape on the end surfaces can be formed by controlling the shape of the resists by providing each mask itself with a pattern, which is smaller than a exposure resolution of the stepper. Further, since the resist masks have tapered shape on the end surfaces, formation of reaction products which is adhered to the side surfaces of the resist masks during the following etching step can be prevented.

Figure 2B:
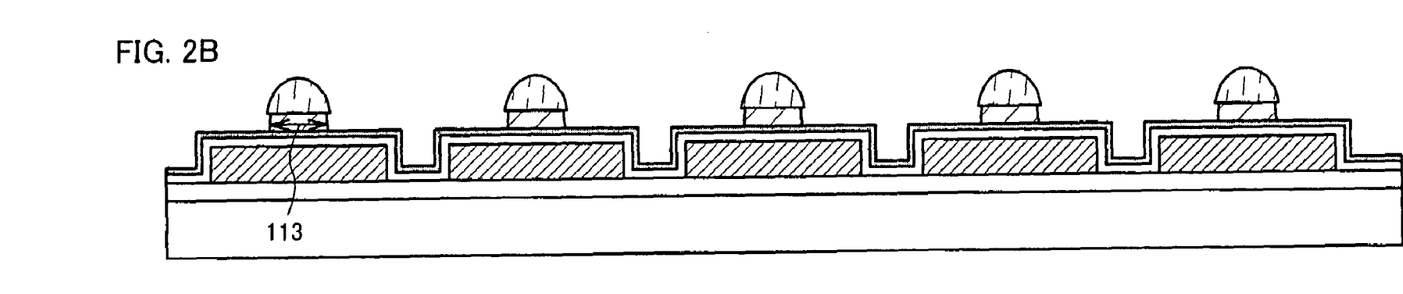

As shown in FIG. 2B, the second conductive film 109b is etched by using the resist mask 110. In this embodiment mode, the second conductive film 109b is etched by dry etching using $CF_4$, Cl, and $O_2$ as a gas. In this case, the etched second conductive films 113 are formed to have tapered shape at the end portion similarly to the resist masks 110. Further, the first conductive film 109a serves as what is called an etching stopper, thus preventing the gate insulating film and the semiconductor film from being etched.

Each of the etched second conductive films 113 has a gate length of from 0.2 μm to 1.0 μm. Further, the resist masks 110 may also recede by some μm. In this embodiment mode, the resist masks 110 are made to recede by 0.4 μm to form the second conductive films 113 with gate length of 0.8 μm.

Figure 2C:
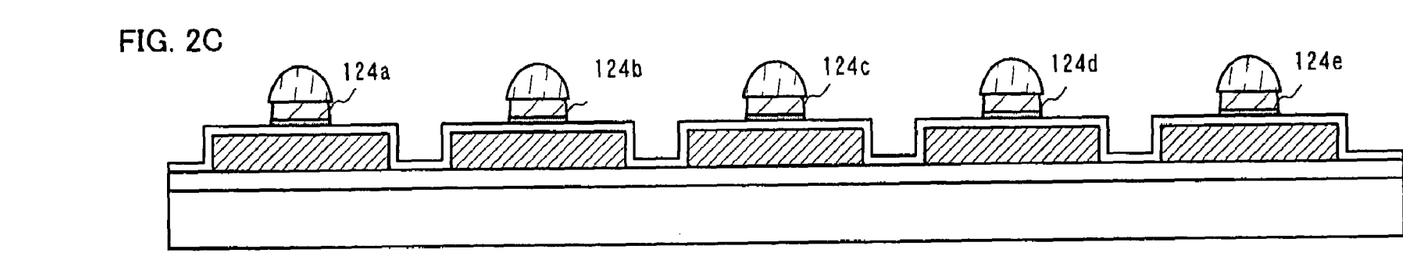

As shown in FIG. 2C, the first conductive film 109a is etched in a state where the resist masks 110 are formed. Hereupon, the first conductive film 109a is etched with high selectivity to the gate insulating film 108. In this embodiment mode, the first conductive film 109a is etched using $Cl_2$ as a gas. In consequence, the gate insulating film 108 is kept thin, and the first conductive film 109a can be etched. In this step, the resist masks 110 and the second conductive films 113 are occasionally etched to some extent and may be even thinner. Thus, gate electrodes 124a to 124e with an extremely short gate length of 1.0 μm or less are formed.

Figure 3A:
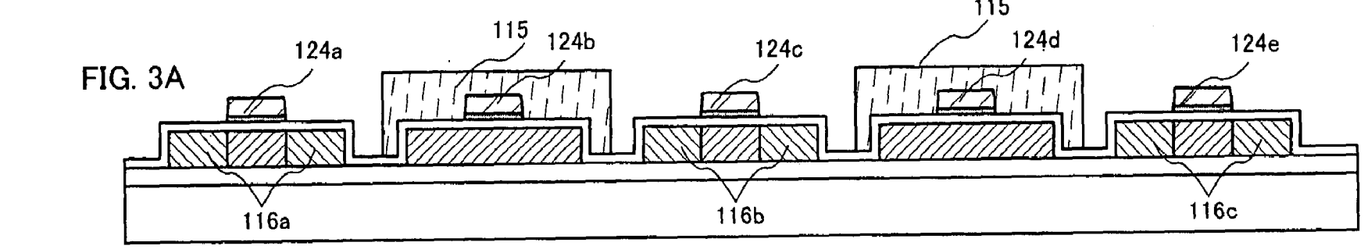
FIGS. 3A to 3C show manufacturing steps of thin film transistors of the invention.

After that, the resist masks 110 are removed by $O_2$ ashing or a resist stripper to form resist masks 15 for impurity doping. As shown in FIG. 3A, the resist masks 115 are formed on regions that are to be p-channel TFTs. The detailed explanation of the method for forming the resist masks is omitted since the above description would serve as a reference.

Subsequently, an impurity element of phosphorus (P) is doped into regions that are to be n-channel TFTs using the gate electrodes 124a, 124c, and 124e as masks. In this embodiment mode, phosphine ($PH_3$) is doped at 60 kV to 80 kV. Thus, impurity regions 116a to 116c are formed in the regions to be n-channel TFTs. In this case, phosphine is doped to the semiconductor film uniformly with depth. However, impurity regions might be formed overlapping the gate electrodes 124a, 124c, and 124e when the impurity element is unintentionally diffused into a part of a channel region. Note that such impurity regions overlapping the gate electrodes 124a, 124c, and 124e should be 0.1 μm to 0.3 μm in length in the channel length direction.

Figure 3B:
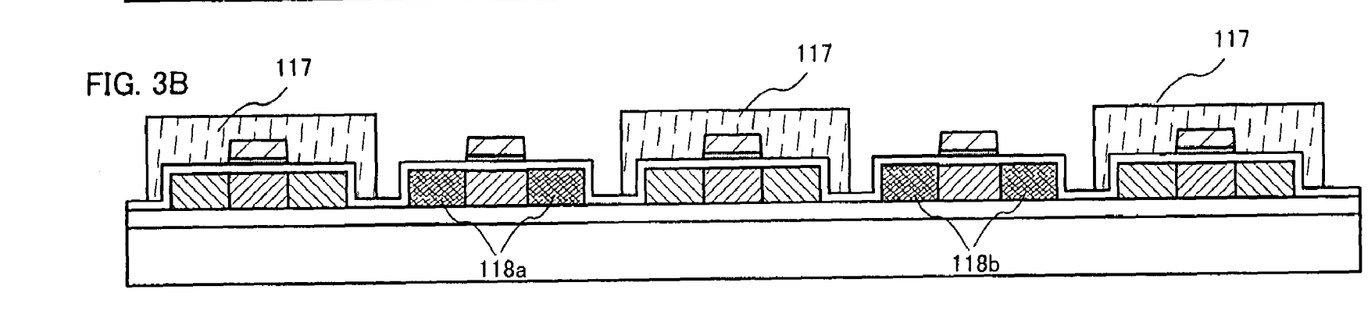

As shown in FIG. 3B, resist masks 117 are formed in regions that are to be n-channel TFTs. Subsequently, an impurity of boron (B) is doped into regions that are to be p-channel TFTs using the gate electrodes 124b and 124d as masks. In this embodiment mode, $B_2H_6$ is doped at 30 kV to 45 kV. Thus, impurity regions 118a to 118c are formed in the regions that are to be p-channel TFTs. The resist masks are thereafter removed by $O_2$ ashing or a resist stripper.

Figure 3C:
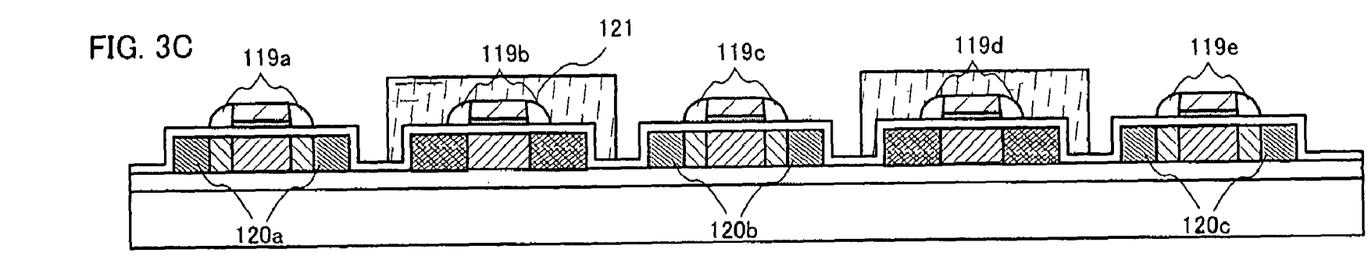

Subsequently, insulating films called sidewalls 119a to 119e are formed so as to cover the side surfaces of the gate electrodes 124a to 124e as shown in FIG. 3C. The sidewalls can be formed with an insulating film containing silicon by plasma CVD or low pressure CVD (LPCVD). In this embodiment mode, a silicon oxynitride (SiON) film is formed by low pressure CVD (LPCVD) using $SiH_4$ and $N_2O$ as a source gas at a pressure of 2 Torr (266 Pa) and a temperature of 400° C. In the case of forming the sidewalls by plasma CVD, a silicon oxynitride (SiON) film can be formed by using $SiH_4$ and $N_2O$ as a source gas at a pressure of 1 Torr (133 Pa). Then, sidewalls with tapered shape are formed by etching the silicon oxynitride (SiON) film.

An etching condition applied in the case of forming the sidewalls by low pressure CVD is as below. As a first etching condition, plasma is generated for some sec, 3 sec for example, by using $CHF_3$ and He as a source gas. At that time, an electrode provided opposite to the substrate (an opposite electrode) in a film formation apparatus is set at 475 W and an electrode on the substrate side (a substrate side electrode) is set at 300 W. The voltage applied to the substrate side electrode can accelerate the ions of the etching gas. As a second etching condition, voltage is applied for several tens of sec, 60 sec for example, using $CHF_3$ and He as a source gas. Etching time can be determined so that etching is finished when the film thickness reaches to the predetermined value (100 nm in this embodiment mode). Hereupon, the opposite electrode in a film formation apparatus is set at 475 W and the substrate side electrode is set at 300 W. As a third etching condition, voltage is applied for several tens of sec, 31 sec for example, after the film to be etched has disappeared, using $CHF_3$ and He as a source gas. In this case, the opposite electrode in a film formation apparatus is set at 50 W and the substrate side electrode is set at 450 W.

An etching condition applied in the case of forming sidewalls by plasma CVD is as below. As a first etching condition, plasma is generated for some sec, 3 sec for example, by using $CHF_3$ and He as a source gas. At that time, the opposite electrode in a film formation apparatus is set at 900 W and the substrate side electrode is set at 150 W. As a second etching condition, voltage is applied for dozens of sec, 50 sec for example, using $CHF_3$ and He as a source gas. Etching time can be determined so that etching is finished when the remaining film thickness reaches to 100 nm. Hereupon, the opposite electrode in a film formation apparatus is set at 475 W and the substrate side electrode is set at 300 W. As a third etching condition, voltage is applied for several tens of sec, 30 sec for example, after the film to be etched has disappeared, using $CHF_3$ and He as a source gas. In this case, the opposite electrode in a film formation apparatus is set at 50 W and an on the substrate side electrode is set at 300 W.

The end portions of the sidewalls may not necessarily have tapered shape, and it is preferable that the side surface stands vertical; namely, it is preferable that the sidewalls have rectangular shape. When the sidewalls have rectangular shape, impurities can be prevented from causing concentration gradient in impurity regions.

High concentration impurity regions 120a to 120c are formed in the impurity regions of the n-channel TFTs by using the sidewalls 119a, 119c, and 119e. Specifically, the high concentration impurity regions 120a to 120c are formed by using the gate electrodes 124a, 124c, and 124e and the sidewalls 119a, 119c, and 119e as masks. At this point, resist masks 121 are formed over the p-channel TFTs. In this embodiment mode, phosphine ($PH_3$) is doped at 15 kV to 25 kV to form the high impurity regions, that is, source regions and drain regions. Thereafter, the resist masks 121 are removed by $O_2$ ashing or a resist stripper.

Further, heat treatment is performed to activate the impurity regions. In this embodiment mode, the heat treatment is performed in a nitrogen atmosphere at 550° C.

Figure 4A:
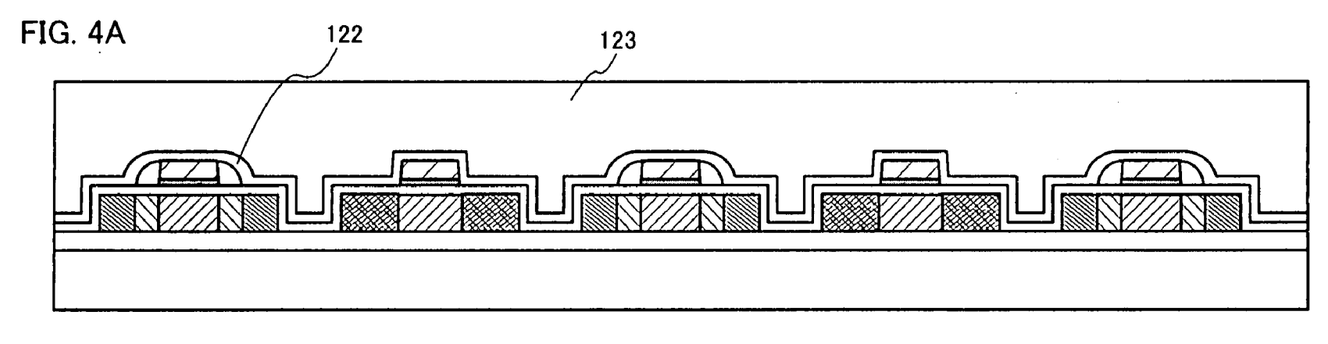
FIGS. 4A and 4B show manufacturing steps of thin film transistors of the invention.

As shown in FIG. 4A, a first insulating film 122 is formed to cover the gate insulating film 108 and the gate electrodes 124a to 124e. The first insulating film 122 may be any insulating film containing nitrogen. In this embodiment mode, a silicon nitride film is formed to a thickness of 100 nm by plasma CVD. Next, heat treatment is performed for activation. In this embodiment mode, heat treatment is performed in a nitrogen atmosphere at 410° C. for one hour. Consequently, film roughness due to the impurity doping can be reduced.

A second insulating film 123 is formed to cover the first insulating film 122. The second insulating film 123 comprises an inorganic material (silicon oxide, silicon nitride, or silicon oxynitride); a photosensitive or non-photosensitive organic material (polyimide, acrylic, polyamide, polyimidamide, benzocyclobutene, or a resist material); a material having a skeletal structure of the combination of silicon (Si) and oxygen (O) and containing hydrogen as a substituent, or the material further containing at least one of fluorine, an alkyl group, and aromatic hydrocarbons as a substituent, what is called siloxane. A stack thereof may also be used. As an organic material, a positive type photosensitive organic resin or a negative type photosensitive organic resin can be used. For example, when a positive type photosensitive acrylic is used as an organic material, an opening with curvature on the top end portions can be formed by etching the positive photosensitive organic resin with exposure by photolithography. In this embodiment mode, a silicon oxynitride film is formed to a film thickness of 600 nm by plasma-CVD using $SiH_4$ and $N_2O$ as a source gas. On this occasion, the substrate is heated to 300° C. to 450° C., 400° C. in this embodiment mode.

Figure 4B:
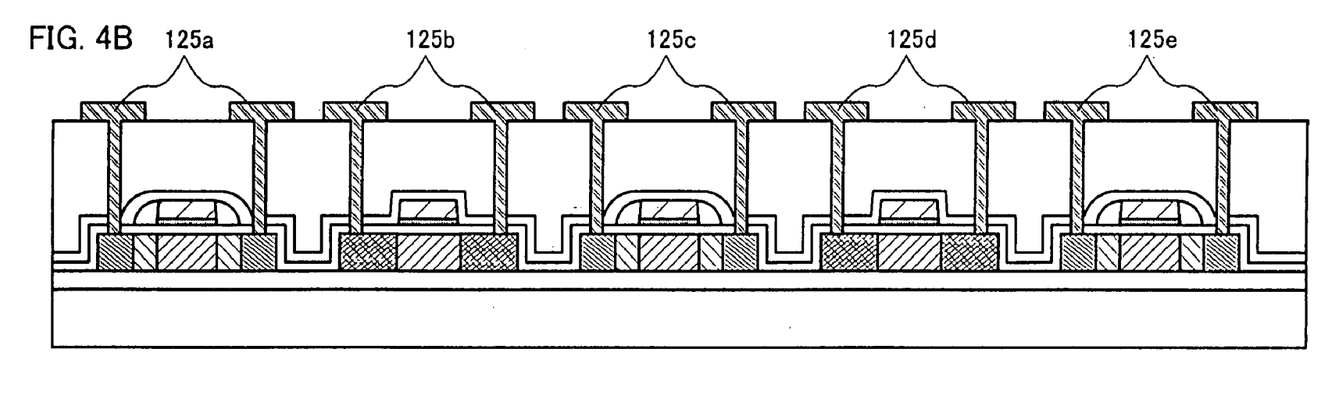

As shown in FIG. 4B, openings, that is contact holes are formed in the gate insulating film 108, the first insulating film 122, and the second insulating film 123, and wirings 125a to 125e connected to the impurity regions are formed. Concurrently, wirings connected to the gate electrodes are formed. Hereupon, the openings are preferably formed vertically with a diameter of about 1.0 µm. Therefore, the resists for forming the contact holes (not shown) are formed so as to have vertical side surfaces on the second insulating film 123. The end portions of the resists are intended not to have tapered shape. Further, when the selectivity of the resists is high considerably, the end portions of the resists may have tapered shape. In this embodiment mode, since a silicon oxynitride film is used for the second insulating film 123, the openings are formed by dry etching using resist masks which are formed to have vertical side surfaces; namely, the resist masks are intended not to have tapered shape. Etching is performed using $CHF_3$ and He as an etching gas, for a first etching time of several sec, 3 sec for example, for a second etching time of 100 sec to 130 sec, 117 sec for example, and for a third etching time of 200 sec to 270 sec, 256 sec for example. Hereupon, flow rate of the etching gas can be determined depending on the etching condition of the openings.

Note that, in the case where an organic material or siloxane is used for the second insulating film 123, a resist mask with higher hardness than a resist mask using an organic materials, an inorganic material such as a silicon oxide film may be used for the resist mask, so that the side surfaces of the openings are made vertical.

Thereafter, the resist masks are removed by $O_2$ ashing or a resist stripper.

Wirings 125a to 125e are formed in the openings. The wirings are formed with a film containing an element selected from aluminum (Al), titanium (Ti), molybdenum (Mo), tungsten (W), and silicon (Si), or an alloy film using the elements thereof. In this embodiment mode, a titanium film/a titanium nitride film/a titanium-aluminum alloy film/a titanium film (Ti/TiN/Al—Si/Ti) are stacked to each have a thickness of 60 nm/40 nm/300 nm/100 nm, and are patterned and etched to the desired shape to form wirings, that is, a source electrode and a drain electrode.

As described above, an n-channel thin film transistor with a LDD structure which is formed to have a low concentration impurity region, with a gate length of 1.0 µm or less is formed. Further, a p-channel thin film transistor having a single drain structure which is formed not to have a low concentration impurity region with a gate length of 1.0 µm or less is formed. Note that a TFT having a gate length of 1.0 µm or less is also referred to as a submicron TFT. A p-channel thin film transistor can have a single drain structure since deterioration due to hot carriers, or short channel effects hardly occur.

According to the invention, a p-channel thin film transistor may have a LDD structure. Further, in a p-channel thin film transistor and an n-channel thin film transistor, a GOLD structure in which a low concentration impurity region overlap a gate electrode can be used instead of the LDD region.

Then, a semiconductor device including a thin film transistor fabricated as described as above, a CPU in this embodiment mode, can be fabricated; thus, high speed operation with an operating frequency of 30 MHz at a drive voltage of 5 V are enabled.

The thin film transistor formed according to this embodiment mode can be used for another semiconductor device, for example, an integrated circuit or a semiconductor display device, especially for a pixel area and a driver circuit area in a semiconductor display device such as a liquid crystal display device, a DMD (Digital Micromirror Device), a PDP (Plasma Display Panel), an FED (Field Emission Display), or the like.

Embodiment Mode 2

Characteristics of an interface between a semiconductor film and a gate insulating film have great effects on the electric properties of a TFT. Therefore, the surface of the semiconductor film is cleaned with hydrofluoric acid or the like before the formation of the gate insulating film. At this point, the semiconductor film is patterned to have a predetermined shape, so that parts of the base film are removed, and dimples or depressions are formed. When the gate insulating film and even a gate electrode are formed with such shape, the step coverage is not enough; accordingly, voltage resistance of the gate insulating film is deteriorated. In particular, the low voltage resistance will be a significant problem as the thickness of the gate insulating film is reduced. Accordingly, a method for forming a gate insulating film whose thickness is made small will be described in this embodiment mode.

Figure 5A:
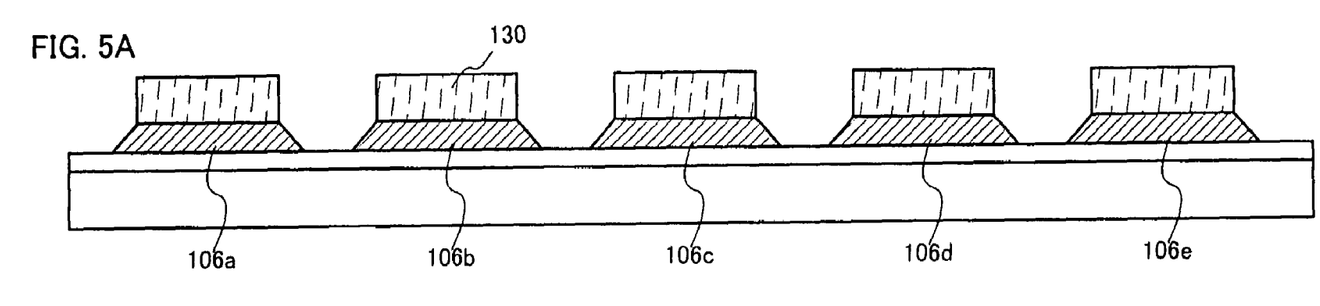
FIGS. 5A to 5C show manufacturing steps of thin film transistors of the invention.

A substrate 100, a base film 101, and an amorphous semiconductor film 102 are formed as in Embodiment Mode 1. The amorphous semiconductor film 102 is crystallized, and semiconductor islands 106a to 106e are formed by using resist masks 130 (FIG. 5A).

Figure 5B:
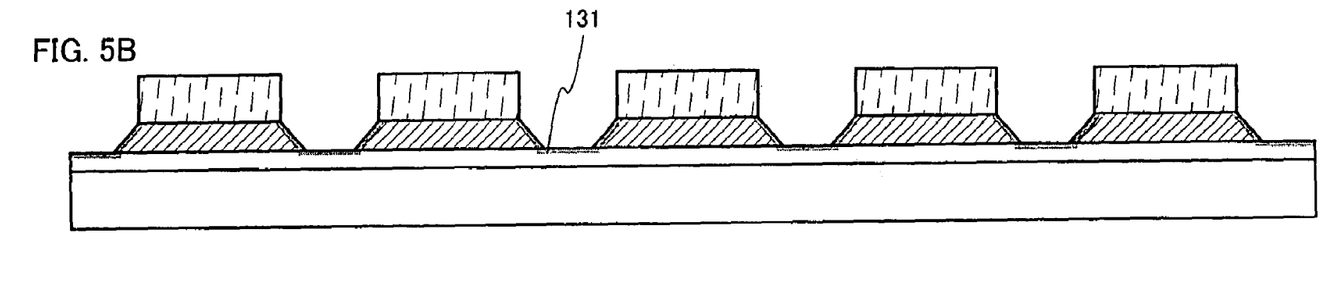

As shown in FIG. 5B, parts of the base film 101 and the side surfaces of the semiconductor islands 106a to 106e are nitrided by being exposed to a nitrogen atmosphere before removing the resist masks 130 used for patterning the semiconductor islands. In this embodiment mode, nitride regions 131 are formed on parts of the surface of the base film 101 and the side surfaces of the semiconductor islands 106a to 106e by plasma treatment using nitrogen ($N_2$) or ammonia ($NH_3$). The nitride regions are formed of silicon nitride (SiN) or silicon oxynitride (SiON) depending on the material of the base film or the semiconductor film. In this embodiment mode, parts of the base film 101 are coated with silicon oxynitride (SiON), and the side surfaces of the semiconductor islands are coated with silicon nitride (SiN). Incidentally, FIG. 5B is a schematic diagram; thus, the nitride region may be different from an actual nitride region. Consequently, dimples or depressions can be prevented from being formed even though the surface of the semiconductor islands are washed with hydrofluoric acid or the like before the formation of the gate insulating film.

Figure 5C:
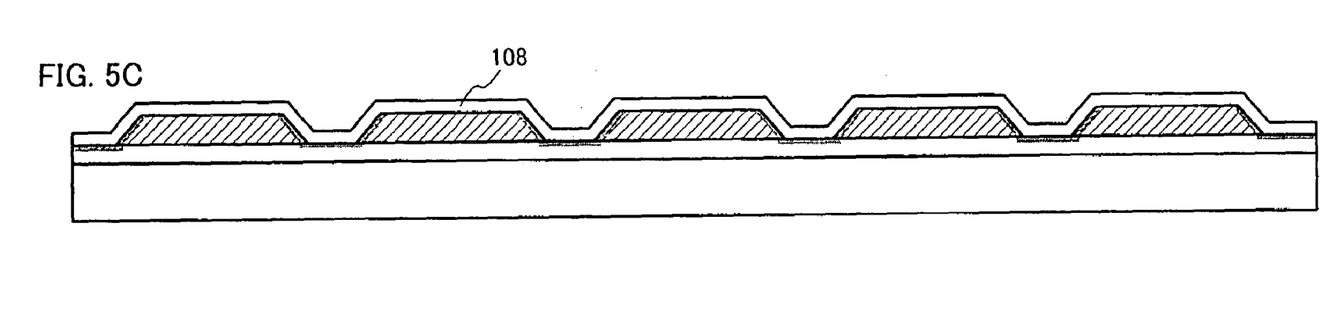

As shown in FIG. 5C, a gate insulating film 108 is formed as in Embodiment Mode 1. The detailed description is omitted since Embodiment Mode 1 would serve as a reference of the subsequent process.

Thus, a semiconductor device including a thin film transistor formed as described above, a CPU in this embodiment mode, can be fabricated. The thin film transistor formed according to this embodiment mode can be used for another semiconductor device, for example, an integrated circuit or a semiconductor display device, especially for a pixel area and a driver circuit area in a semiconductor display device such as a liquid crystal display device, a DMD (Digital Micromirror Device), a PDP (Plasma Display Panel), an FED (Field Emission Display), or the like.

Embodiment Mode 3

In this embodiment mode, a central processor unit will be described with reference to a block diagram.

Figure 6:
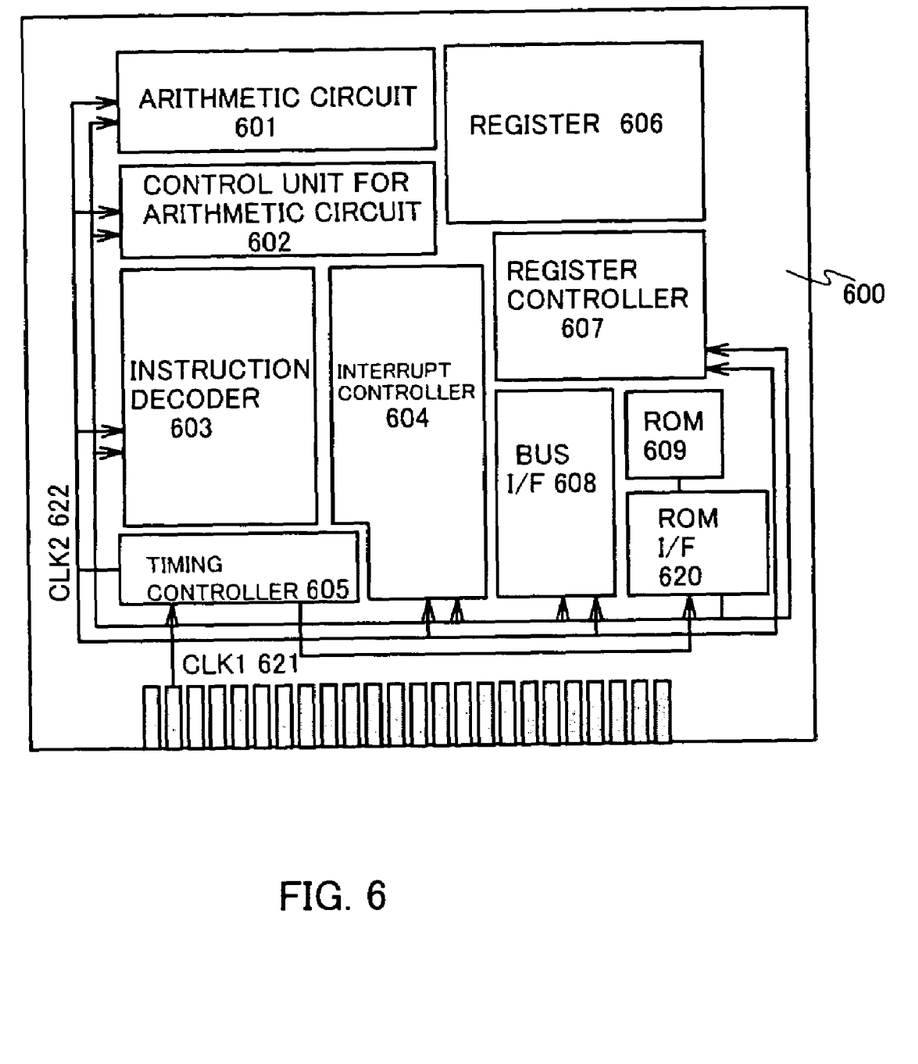
FIG. 6 is a block diagram of a CPU according to the invention.

A CPU shown in FIG. 6A mainly includes an arithmetic circuit (ALU: Arithmetic Logic Unit) 601, a control unit for an arithmetic circuit (ALU controller) 602, an instruction decoder 603, and an interrupt controller 604, a timing controller 605, a register 606, a register controller 607, a bus interface (bus I/F) 608, a rewritable ROM 609, and a ROM interface (ROM I/F) 620 over a substrate 600. Further, the rewritable ROM 609 and the ROM interface (ROM I/F) 620 may be provided over another chip.

Each of the above described circuits may be formed with a thin film transistor formed over a glass substrate according to any one of methods described in Embodiment Modes 1 and 2.

FIG. 6 shows only an example of simplified configuration of a CPU. Accordingly, actual CPUs may have various structures depending on the usages.

An instruction input into the CPU via the bus interface 608 is then input to the instruction decoder 603 and decoded, and further input into the control unit for an arithmetic circuit 602, the interrupt controller 604, the register controller 607, and the timing controller 605.

The control unit for an arithmetic circuit 602, the interrupt controller 604, the register controller 607, and the timing controller 605 perform control based on decoded instructions. Specifically, the control unit for an arithmetic circuit 602 generates a signal for controlling the operation of the arithmetic circuit 601. The interrupt controller 604 handles the interrupt request from a peripheral circuit and an external input-output device evaluated from the priority or the mask condition during execution of the program of the CPU. The register controller 607 generates an address of the register 606, and performs reading and writing in accordance with the state of the CPU.

The timing controller 605 generates signals for controlling timing of the operations of the arithmetic circuit 601, the control unit for an arithmetic circuit 602, the instruction decoder 603, the interrupt controller 604, and the register controller 607. For example, the timing controller 605 has an internal clock generation unit where an internal clock signal CLK2 (622) is generated from base clock CLK1 (621), and the clock signal CLK2 is supplied to the above circuits.

In this embodiment mode, a CPU is explained as an example of a semiconductor device; however, the thin film transistor formed over a glass substrate, according to the invention can be used for a display device including a light emitting element typified by an organic light emitting element in each pixel. The thin film transistor formed according to this embodiment mode can be used for another semiconductor device, for example, an integrated circuit or a semiconductor display device, especially for a pixel area and a driver circuit area in a semiconductor display device such as a liquid crystal display device, a DMD (Digital Micromirror Device), a PDP (Plasma Display Panel), an FED (Field Emission Display), or the like. As examples of semiconductor devices fabricated according to the invention, a digital camera, a sound reproduction device such as a car audio, a notebook personal computer, a game machine, a portable information terminal (a cellular phone, a portable game machine, and the like), and an image reproduction device equipped with a recording medium such as a home video game machine can be given.

The thin film transistor formed according to the invention particularly has a short gate length, so that the drive voltage will be reduced when it is used for the driver circuit area. Further, by using the above TFTs, high precision is achieved; namely, a pixel area in which shorter intervals are provided between respective pixels can be obtained.

Consequently, in the case of forming a thin film transistor over a glass substrate, only inexpensive materials are required; thus, a low cost CPU or other semiconductor devices can be fabricated.

Embodiment Mode 4

In this embodiment mode, modes of a CPU will be described.

Figure 7:
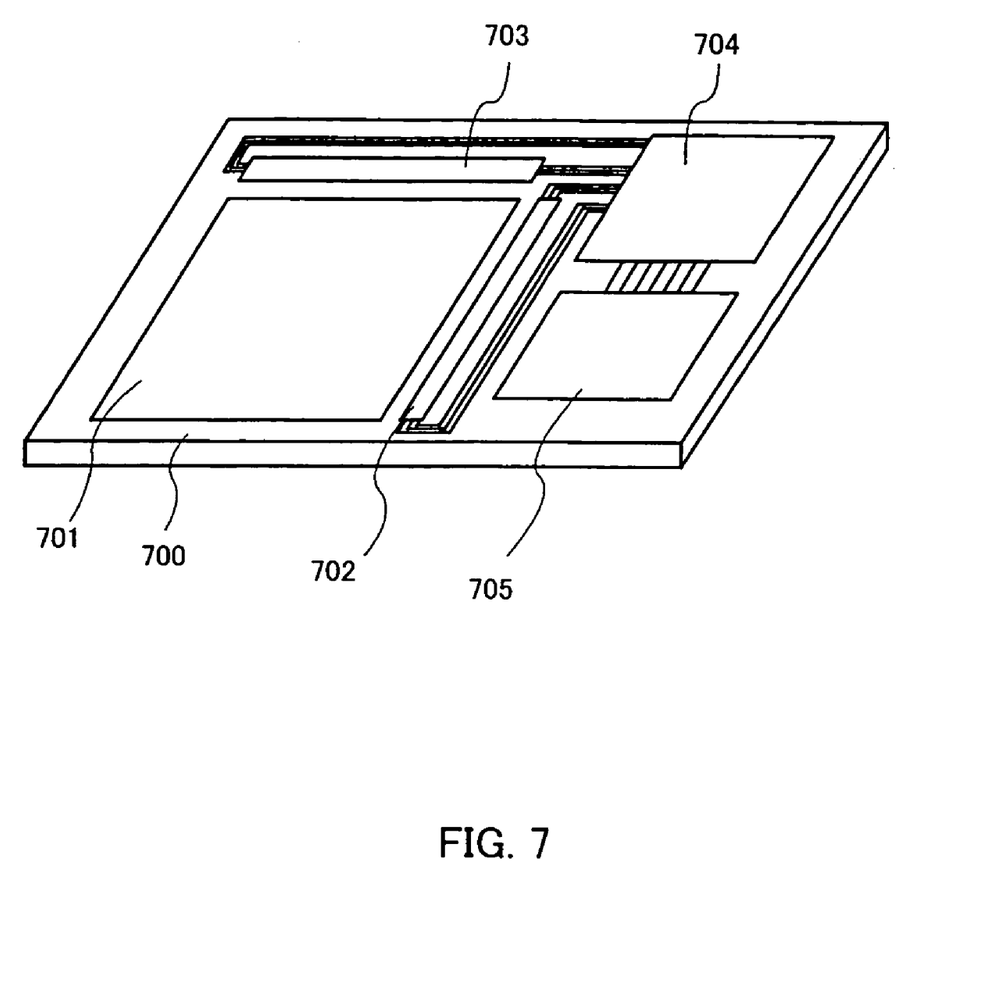
FIG. 7 is a figure showing a display device mounted with a CPU according to the invention.

FIG. 7 shows a display device in which a pixel area, a CPU, and other circuits are formed over one substrate, what is called a system on panel. A pixel area 701, a scan line driver circuit 702 which selects a pixel of the pixel area 701, and a signal line driver circuit 703 which supplies a video signal to the selected pixel are provided over a substrate 700. Wirings lead from the scan line driver circuit 702 and the signal line driver circuit 703 connects a CPU 704 and other circuits such as a control circuit 705. The control circuit includes an interface. A connection area with an FPC terminal is provided at the end portion of the substrate to be inputted external signals As other circuits, a video signal processing circuit, a power supply circuit, a gradation power supply circuit, a video RAM, a memory (DRAM, SRAM, PROM), and the like may be provided over the substrate. These circuits may be formed with IC chips and mounted on the substrate. Further, the scan line driver circuit 702 and the signal line driver circuit 703 are not necessarily formed over the substrate provided with a pixel area. For example, only the scan line driver circuit 702 may be formed over a substrate where a pixel area is formed, and the signal line driver circuit 703 may be formed with an IC chip and mounted on the substrate afterwards.

Figure 8A:
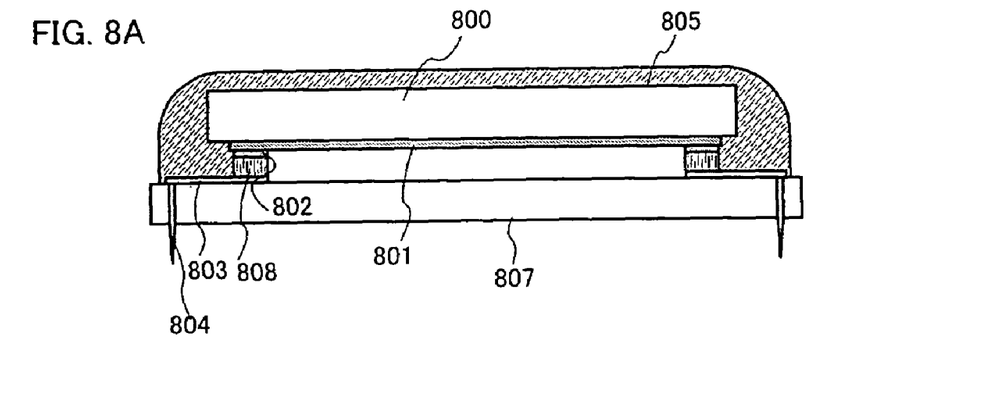
FIGS. 8A to 8C show CPUs according to the invention.

FIG. 8A shows a mode of a packaged CPU. A transistor array 801 serving as a CPU provided on a substrate 800 is set face down so that an electrode (a source electrode, a drain electrode, or another electrode formed over the source or darin electrode with an insulating film therebetween) 802 over the surface of the CPU is provided downward. The substrate 800 can use glass or plastic. A wiring board provided with a wiring 803 comprising copper or an alloy of copper, a printed circuit board 807 here, is prepared. The printed circuit board 807 is provided with a connection terminal (pin) 804. The electrode 802 and the wiring 803 are connected via an anisotropic conductive film 808. Subsequently, the substrate 800 is covered with a resin 805 such as epoxy resin from the top; thus, a packaged CPU can be completed. Alternatively, the periphery thereof may be surrounded with a plastic 815 or the like with hollow space kept inside.

Figure 8B:
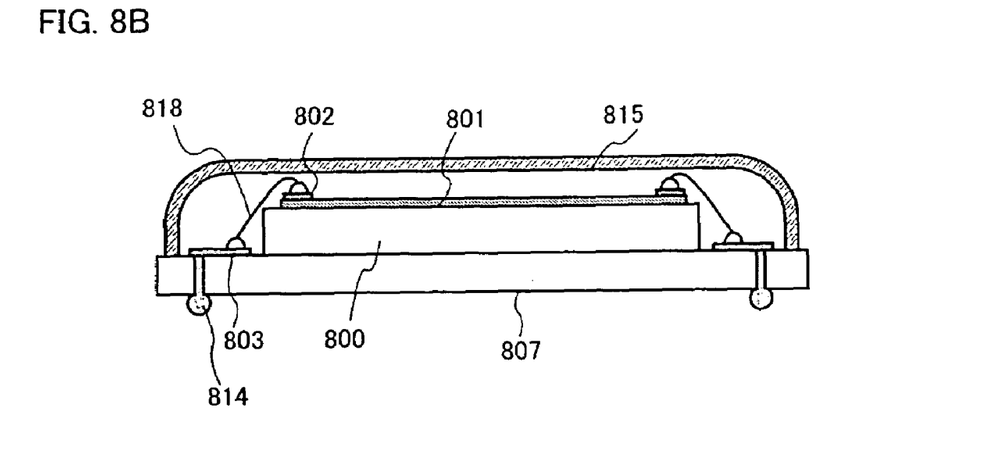

In FIG. 8B, a CPU is mounted face up as an electrode 802 provided on the surface of a CPU is set upward, unlike in FIG. 8A. A substrate 800 is fixed to a printed circuit board 807, and the electrode 802 and a wiring 803 are connected via a wire 818. Such connection using a wire is called wire bonding. The electrode 802 and a bump 814 connected to the wiring 803 are connected. Finally, the periphery is surrounded with a plastic 815 with hollow space kept inside; thus, a packaged CPU is completed.

Figure 8C:
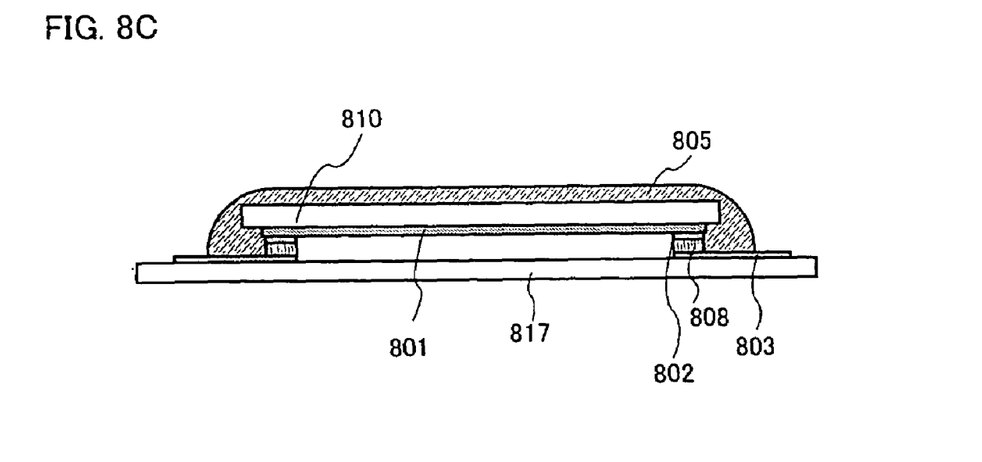

FIG. 8C shows an example of fixing a transistor array 801 serving as a CPU formed over a flexible substrate such as an FPC (flexible printed circuit). The transistor array 801 serving as a CPU formed over the substrate 810 is set face down so that an electrode 802 over the surface of the CPU is provided downward. The substrate 800 can use glass, quartz, metal, a bulk semiconductor, or plastic. In the case of FIG. 8C, a highly flexible plastic is preferably used as a substrate. An FPC 807 provided with a wiring 803 formed of copper or an alloy of copper is prepared. The electrode 802 and the wiring 803 are connected via an anisotropic conductive film 808. Subsequently, the substrate 800 is covered with a resin 805 such as epoxy resin from the top; thus, a packaged CPU can be completed.

Thus packaged CPU is protected from outside, and further, it is easier to be carried. The CPU can be mounted on a desired portion. In particular, in the case where the completed CPU is flexible as in FIG. 8C, it can be mounted on a desired portion more freely. Further, the function of the CPU can be supported by packaging.

As described above, a CPU comprising a thin film transistor formed over a glass substrate can take diverse modes. Further, the CPU fabricated with a thin film transistor formed over a glass substrate is light in weight; thus, difficulties in carrying and mounting can be reduced.

Embodiment Mode 5

In this embodiment mode, a fabrication process which is different from the above embodiment modes will be described.

Figure 9A:
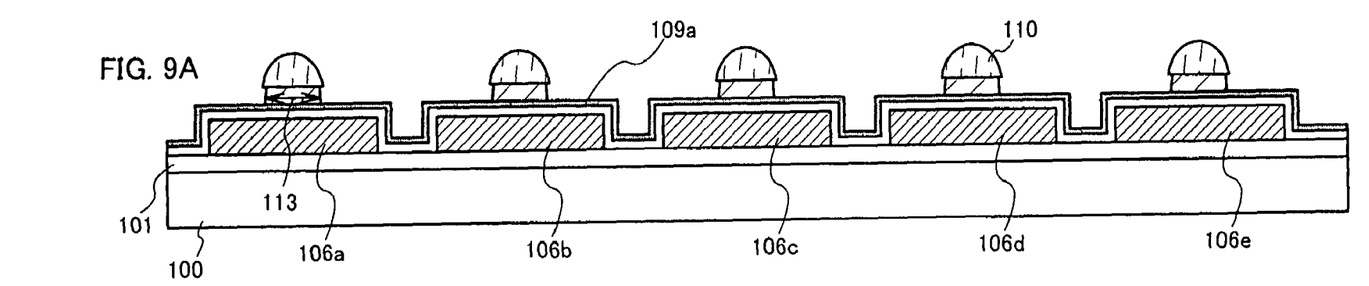
FIGS. 9A to 9C show manufacturing steps of thin film transistors of the invention.

As shown in FIG. 9A, after forming resist masks 110 according to the above embodiment modes, conductive films 113 is formed by etching the conductive film 109b using the resist masks 110.

Figure 9B:
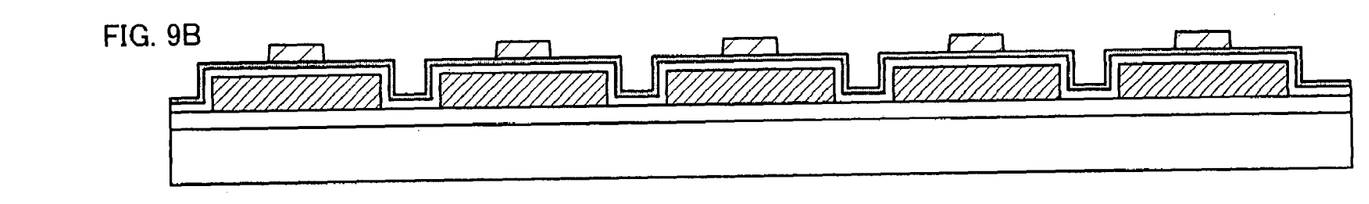

Thereafter, as shown in FIG. 9B, the resist masks 110 are removed. Further, as shown in a FIG. 9C, a conductive film 109a is etched by using the etched conductive films 113. As thus described, the conductive film 109a can be etched without the use of a resist mask.

The above embodiment modes would serve as reference to subsequent steps.

Figure 9C:
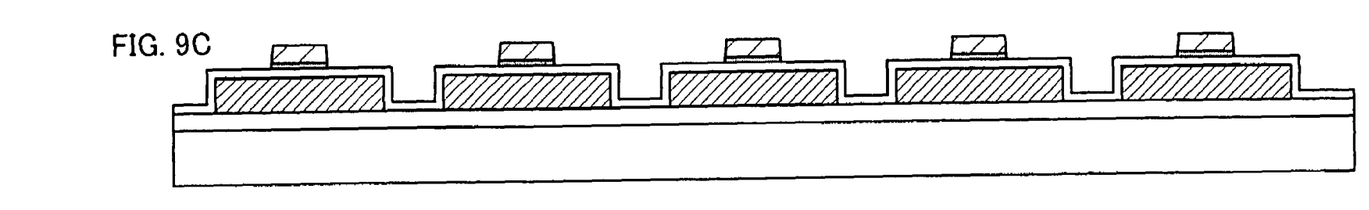

In this embodiment mode, the conductive film 109a is etched by using the conductive films 113 after removing the resist masks. Thus, the conductive film can be etched without being affected by the shape of the resist mask.

A semiconductor device including a thin film transistor formed as described above, a CPU for example can be fabricated, and high speed operation is enabled.

What is claimed is:

1. A method of manufacturing a semiconductor device, comprising steps of:
    forming an amorphous semiconductor film over a glass substrate;
    forming a crystalline semiconductor film by irradiating the amorphous semiconductor film with laser light;
    nitriding at least a portion of the crystalline semiconductor film;
    forming a conductive film over the crystalline semiconductor film;
    forming a mask having a tapered shape over the conductive film; and
    forming a gate electrode by etching the conductive film using the mask,
    wherein the conductive film is etched so that the gate electrode has a gate length of 1.0 µm or less.

2. A method according to claim 1, wherein the conductive film is formed to have a first conductive film and a second conductive film stacked in order, and the first conductive film is used as an etching stopper when the second conductive film is etched by using the mask.

3. A method according to claim 1, wherein the mask having the tapered shape is formed over the conductive film by exposing and baking a resist material.

4. A method according to claim 1, wherein the conductive film is etched by one of dry etching and wet etching.

5. A method according to claim 1, wherein one or more of laser selected from the group consisting of Ar laser, Kr laser, excimer laser, YAG laser, $Y_2O_3$ laser, $YVO_4$ laser, YLF laser, $YAlO_3$ laser, glass laser, ruby laser, alexandrite laser, Ti: sapphire laser, copper vapor laser, and gold vapor laser are used for the laser light.

6. A method according to claim 1, further comprising steps of:
adding a metal element which promotes crystallization over the amorphous semiconductor film; and
performing a heat treatment before the irradiation with the laser light.

7. A method according to claim 6, wherein the metal element is one or more elements selected from the group consisting of Ni, Fe, Co, Pd, Pt, Cu, Au, Ag, In, and Sn.

8. A method according to claim 6, wherein a solution containing the metal element is selectively applied to the amorphous semiconductor film by spin coating.

9. A method according to claim 6, wherein the metal element is selectively applied to the amorphous semiconductor film by one of dip coating, ion implantation, and sputtering.

10. A method of manufacturing a CPU, wherein a semiconductor device manufactured according to claim 1 is used.

11. A method of manufacturing a semiconductor device, comprising steps of:
forming an amorphous semiconductor film over a glass substrate;
forming a crystalline semiconductor film by irradiating the amorphous semiconductor film with continuous wave laser light;
nitriding at least a portion of the crystalline semiconductor film;
forming a conductive film over the crystalline semiconductor film;
forming a mask having a tapered shape which is formed with a resist over the conductive film; and
forming a gate electrode by etching the conductive film by using the mask,
wherein the conductive film is etched so that the gate electrode has a gate length of 1.0 µm or less.

12. A method according to claim 11, wherein the conductive film is formed to have a first conductive film and a second conductive film stacked in order, and the first conductive film is used as an etching stopper when the second conductive film is etched by using the mask.

13. A method according to claim 11, wherein the mask having the tapered shape is formed over the conductive film by exposing and baking a resist material.

14. A method according to claim 11, wherein the conductive film is etched by one of dry etching and wet etching.

15. A method according to claim 11, further comprising steps of:
adding a metal element which promotes crystallization over the amorphous semiconductor film; and
performing a heat treatment before the irradiation with the laser light.

16. A method according to claim 15, wherein the metal element is nickel.

17. A method according to claim 15, wherein the metal element is one or more elements selected from the group consisting of Ni, Fe, Co, Pd, Pt, Cu, Au, Ag, In, and Sn.

18. A method according to claim 15, wherein a solution containing the metal element is selectively applied to the amorphous semiconductor film by spin coating.

19. A method according to claim 15, wherein the metal element is selectively applied to the amorphous semiconductor film by one of dip coating, ion implantation, and sputtering.

20. A method of manufacturing a CPU, wherein a semiconductor device manufactured according to claim 11 is used.

21. A method of manufacturing a semiconductor device, comprising steps of:
forming a base film over a glass substrate;
forming an amorphous semiconductor film over the base film;
forming a crystalline semiconductor film by irradiating the amorphous semiconductor film with laser light;
patterning the crystalline semiconductor film;
nitriding a portion of the base film and at least a portion of the crystalline semiconductor film;
washing a surface of the crystalline semiconductor film;
forming a gate insulating film over the crystalline semiconductor film;
forming a conductive film over the gate insulating film;
forming a mask having a tapered shape over the conductive film; and
forming a gate electrode by etching the conductive film using the mask,
wherein the conductive film is etched so that the gate electrode has a gate length of 1.0 µm or less.

22. A method according to claim 21, wherein the conductive film is formed to have a first conductive film and a second conductive film stacked in order, and the first conductive film is used as an etching stopper when the second conductive film is etched by using the mask.

23. A method according to claim 21, wherein the mask having the tapered shape is formed over the conductive film by exposing and baking a resist material.

24. A method according to claim 21, wherein the conductive film is etched by one of dry etching and wet etching.

25. A method according to claim 21, wherein one or more of laser selected from the group consisting of Ar laser, Kr laser, excimer laser, YAG laser, $Y_2O_3$ laser, $YVO_4$ laser, YLF laser, $YAlO_3$ laser, glass laser, ruby laser, alexandrite laser, Ti: sapphire laser, copper vapor laser, and gold vapor laser are used for the laser light.

26. A method according to claim 21, further comprising steps of:
adding a metal element which promotes crystallization over the amorphous semiconductor film; and
performing a heat treatment before the irradiation with the laser light.

27. A method according to claim 26, wherein the metal element is one or more elements selected from the group consisting of Ni, Fe, Co, Pd, Pt, Cu, Au, Ag, In, and Sn.

28. A method according to claim 26, wherein a solution containing the metal element is selectively applied to the amorphous semiconductor film by spin coating.

29. A method according to claim 26, wherein the metal element is selectively applied to the amorphous semiconductor film by one of dip coating, ion implantation, and sputtering.

30. A method of manufacturing a CPU, wherein a semiconductor device manufactured according to claim 21 is used.

31. A method of manufacturing a semiconductor device, comprising steps of:
forming an amorphous semiconductor film over a glass substrate;
forming a crystalline semiconductor film by irradiating the amorphous semiconductor film with laser light;
nitriding at least a portion of the crystalline semiconductor film;
forming a conductive film over the crystalline semiconductor film;
forming a mask having a tapered shape over the conductive film;
forming a gate electrode by etching the conductive film by using the mask;
forming an impurity region by adding an impurity element to the crystalline semiconductor film using the gate electrode as a mask;
forming an insulating film which covers the gate electrode and the crystalline semiconductor film;
forming an opening in the insulating film by using a mask having a vertical end portion so that the impurity region and a wiring are connected; and
forming a wiring so as to connect with the impurity region via the opening,
wherein the conductive film is etched so that the gate electrode has a gate length of 1.0 µm or less.

32. A method according to claim 31, wherein the conductive film is formed to have a first conductive film and a second conductive film stacked in order, and the first conductive film is used as an etching stopper when the second conductive film is etched by using the mask.

33. A method according to claim 31, wherein the mask having the tapered shape is formed over the conductive film by exposing and baking a resist material.

34. A method according to claim 31, wherein the conductive film is etched by one of dry etching and wet etching.

35. A method according to claim 31, wherein one or more of laser selected from the group consisting of Ar laser, Kr laser, excimer laser, YAG laser, $Y_2O_3$ laser, $YVO_4$ laser, YLF laser, $YAlO_3$ laser, glass laser, ruby laser, alexandrite laser, Ti: sapphire laser, copper vapor laser, and gold vapor laser are used for the laser light.

36. A method according to claim 31, further comprising steps of:
adding a metal element which promotes crystallization over the amorphous semiconductor film; and
performing a heat treatment before the irradiation with the laser light.

37. A method according to claim 36, wherein the metal element is one or more elements selected from the group consisting of Ni, Fe, Co, Pd, Pt, Cu, Au, Ag, In, and Sn.

38. A method according to claim 36, wherein a solution containing the metal element is selectively applied to the amorphous semiconductor film by spin coating.

39. A method according to claim 36, wherein the metal element is selectively applied to the amorphous semiconductor film by one of dip coating, ion implantation, and sputtering.

40. A method of manufacturing a CPU, wherein a semiconductor device manufactured according to claim 31 is used.

* * * * *